(12) United States Patent
Koo et al.

(10) Patent No.: US 7,535,977 B2
(45) Date of Patent: May 19, 2009

(54) SIGMA-DELTA BASED PHASE LOCK LOOP

(75) Inventors: Yido Koo, Seoul (KR); Youngho Ahn, Seoul (KR); Eunseok Song, Seoul (KR); Jeong-Woo Lee, Seoul (KR); Joonbae Park, Seoul (KR); Kyeongho Lee, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 0 days.

(21) Appl. No.: 11/227,909

(22) Filed: Sep. 16, 2005

(65) Prior Publication Data
US 2006/0068737 A1    Mar. 30, 2006

Related U.S. Application Data

(60) Provisional application No. 60/614,402, filed on Sep. 30, 2004.

(51) Int. Cl.
*H03D 3/18* (2006.01)
(52) U.S. Cl. ............... 375/327; 375/374; 375/375; 375/376; 327/148; 327/157
(58) Field of Classification Search ............. 375/376, 375/375, 374, 327; 327/157, 156, 147, 148
See application file for complete search history.

(56) References Cited

U.S. PATENT DOCUMENTS

| | | | | | |
|---|---|---|---|---|---|
| 4,987,387 | A | * | 1/1991 | Kennedy et al. | 331/1 A |
| 7,034,588 | B2 | * | 4/2006 | Cheung et al. | 327/157 |
| 2003/0034846 | A1 | * | 2/2003 | Fan | 331/17 |
| 2004/0263272 | A1 | * | 12/2004 | Ravi et al. | 331/177 V |
| 2005/0185746 | A1 | * | 8/2005 | Jung | 375/374 |

* cited by examiner

*Primary Examiner*—Temesghen Ghebretinsae

(57) ABSTRACT

A sigma-delta based phase lock loop device is provided that includes a phase frequency detector (PFD), a charge pump and a voltage controlled oscillator. The PFD to receive a reference signal and a feedback signal and to output signals based on a comparison of the reference signal and the feedback signal. The charge pump to output a charge based on the output signals from the PFD. The charge pump including a first current source to apply a fixed amount of current and a second current source to apply a variable amount of current. The voltage controlled oscillator to output a clock signal based on the received charge from the charge pump.

25 Claims, 12 Drawing Sheets

SIGMA-DELTA BASED PHASE LOCK LOOP

This application claims priority to U.S. Provisional Application No. 60/614,402, filed Sep. 30, 2004. Incorporation by reference of the entire disclosure of the prior application is considered as being part of the disclosure of this application and is hereby incorporated by reference herein.

BACKGROUND OF THE INVENTION

1. Field of the Invention

Embodiments of the present invention may relate to phase locked loop circuits.

2. Background of Related Art

Modern communication device, such as cellular telephones, may employ a phase locked loop device for frequency synthesis of a communication carrier signal modulated with transmission data. The phase locked loop device enables the carrier signal frequency to be precisely controlled and accordingly enables the data on which the carrier signal modulation is based to be reliably transmitted at a stable, known frequency. In such a phase locked loop (PLL) frequency synthesizer, a voltage controlled oscillator (VCO) produces the output carrier signal at the desired frequency based on a VCO frequency control signal. In a simplified PLL configuration, this control is achieved by a feedback loop, with the VCO output signal coupled via the feedback loop to a phase-frequency detector which compares the VCO signal phase or frequency to that of a fixed-frequency reference signal and produces a frequency control signal corresponding to the phase difference between the VCO signal and the fixed-frequency signal. This frequency control signal is smoothed by a low pass loop filter and then applied to the VCO such that in its steady state the VCO output signal frequency matches that of the fixed-frequency reference signal.

A frequency divider may be included in the PLL feedback loop to enable division of the frequency of the VCO output signal to a frequency that is a multiple of that of a fixed-frequency reference source. The output of the frequency divider is compared by the phase-frequency detector to the fixed-frequency source for controlling the VCO phase. In this way, the frequency of a carrier signal produced by the VCO is constantly controlled such that it is "phase locked" to a multiple of that of the fixed-frequency reference.

SUMMARY OF THE INVENTION

Embodiments of the present invention may provide a sigma-delta based phase lock loop device that includes a phase frequency detector, a charge pump, a loop filter, a voltage controlled oscillator and a divider circuit. The phase frequency detector may receive a reference signal and a feedback signal and output UP/DOWN signals based on a comparison of the reference signal and the feedback signal. The charge pump may output a charge based on the output signals from the phase frequency detector. The charge pump may include a first current source to apply a fixed amount of current and a second current source to apply a variable amount of current. The voltage controlled oscillator may output a clock signal based on the received charge from the charge pump. The divider circuit may receive the clock signal output from the voltage controlled oscillator and output the feedback signal to the phase frequency detector. A sigma-delta modulator may be coupled to the divider circuit.

The variable amount of current of the second current source may be based on a phase error of the reference signal and the feedback signal at the phase frequency detector. Further, an amount of the charge output by the charge pump may be linearly proportional to a phase difference between the reference signal and the feedback signal at the phase frequency detector.

Still further, a magnitude of the first current source may be greater than a magnitude of the second current source. The different magnitudes may provide phase offset at a locked condition of the phase lock loop device.

Additional advantages, objects, features and embodiments of the invention may be set forth in part in the description that follows and in part may become apparent to those having ordinary skill in the art upon examination of the following or may be learned from practice of the invention.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

The following represents brief descriptions of the drawings in which like reference numerals refer to like elements and wherein.

DETAILED DESCRIPTION OF PREFERRED EMBODIMENTS

Figure 1:
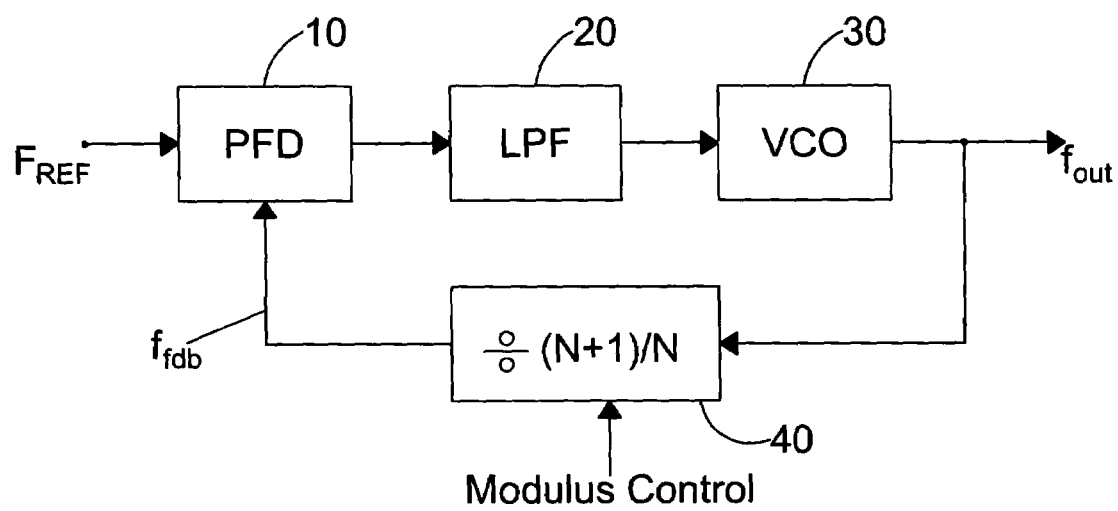
FIG. 1 is a block diagram of a PLL based frequency synthesizer according to an example arrangement.

In the following detailed description, like reference numerals and characters may be used to designate identical, corresponding or similar components in differing figure drawings. Further, in the detailed description to follow, example sizes/models/values/ranges may be given although embodiments of the present invention are not limited to the same. Further, arrangements and embodiments may be shown in block diagram form in order to avoid obscuring the invention, and also in view of the fact that specifics with respect to implementation of such block diagram arrangements may be dependent upon the platform within which the present invention is to be implemented. That is, the specifics may be well within the purview of one skilled in the art. Where specific details are set forth in order to describe example embodiments of the invention, it should be apparent to one skilled in the art that embodiments of the present invention can be practiced without these specific details.

The following discussion may use the terminologies signal (s) and signal line(s) interchangeable with respect to the figures. That is, the terminology signal may correspond to a signal line as shown in the figures. Arrangements and embodiments may also be described with respect to signals being input or output from different circuit components. While the discussion identifies a signal, the signal may be transmitted over a signal line or other type of mechanism. Further, while values or signals may be described as HIGH or LOW and/or UP or DOWN, these descriptions are intended to be relative to the discussed arrangement and/or embodiment. For example, a value or signal may be described as HIGH in one arrangement although it may be LOW if provided in another arrangement, such as with a change in logic. The terms HIGH and LOW may be used in an intended generic sense. Embodiments and arrangements may be implemented with a total/partial reversal of the HIGH and LOW signals by a change in logic.

A Phase-Locked Loop (PLL) may be used in wireline and wireless applications to generate a carrier frequency or a timing reference (such as a clock signal). FIG. 1 is a block diagram of a PLL based frequency synthesizer according to an example arrangement. Other arrangements are also possible. More specifically, FIG. 1 shows a PLL that includes a phase frequency detector (PFD) 10, a low-pass filter (LPF) 20 (or loop filter), a voltage controlled oscillator (VCO) 30 and a feedback divider circuit 40. The PFD 10 receives a reference signal $f_{ref}$ and also receives a feedback signal $f_{fdb}$ from the divider circuit 40. The PFD 10 makes a comparison of the reference signal $f_{ref}$ and the feedback signal $f_{fdb}$ and outputs signals to the VCO 30 through the low pass filter 20. The filtered signal is basically a slowly changing or varying DC signal applied to the VCO 30. The VCO 30 outputs a VCO signal ($f_{out}$) that may be used as a clocking signal. The VCO output signal $f_{out}$ may also be input to the feedback divider 40, which outputs the feedback signal $f_{fdb}$ to the PFD 10 for comparison with the reference signal $f_{ref}$.

There may be a trade-off between a loop bandwidth and channel spacing. That is, when an integer-N PLL is used, channel spacing may be the same as a comparison frequency. The loop bandwidth may be smaller than the comparison frequency by a factor of ten. Since the lock time is inversely proportional to the loop bandwidth, the loop bandwidth may be made smaller to reduce the lock time. In addition to this trade-off, phase noise may also be affected by the loop bandwidth. As the in-band phase noise is reduced by increasing the loop-bandwidth, the phase noise is also improved by the same factor. However, the restriction of the channel spacing or the frequency resolution of the synthesized output limits the use of the PLL with wide loop bandwidth.

Figure 2:
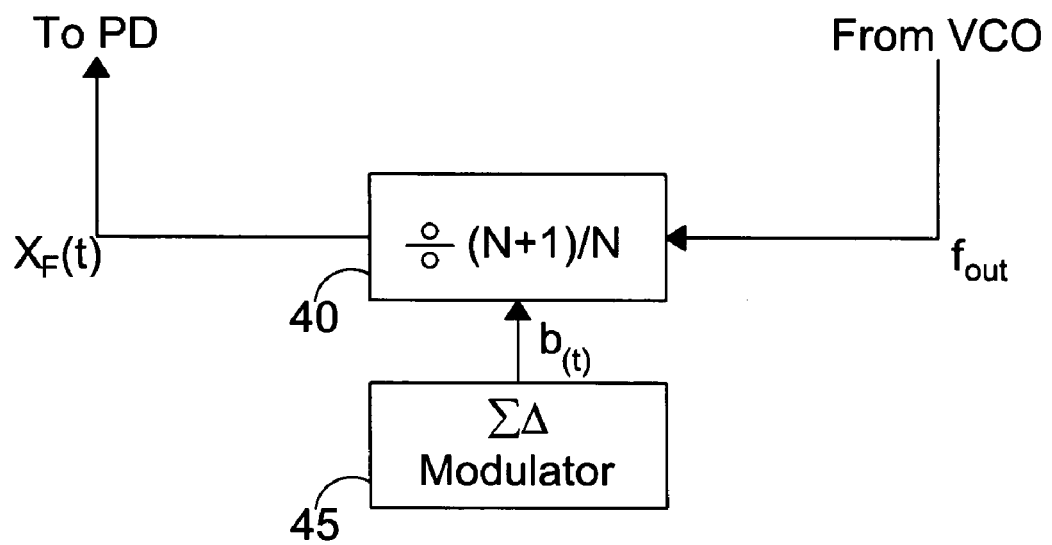
FIG. 2 is a partial diagram of a sigma-delta based PLL according to an example arrangement.

FIG. 2 is a partial diagram of a sigma-delta based PLL according to an example arrangement. Other arrangements are also possible. For ease of illustration, FIG. 2 only shown portions of the sigma-delta based PLL. FIG. 2 does not show the PFD 10, the low pass filter 20 and the VCO 30 that also may form the PLL. The sigma-delta based PLL may have a fast switching time and an arbitrarily small frequency resolution. More specifically, in a sigma-delta based PLL, the divider 40 in the feedback path may be controlled by a sigma-delta modulator 45 for fine frequency resolution. Equation (1) shows a frequency generation equation for a sigma-delta based PLL, such as shown in FIG. 2.

$$f_{vco} = \frac{f_{ref}}{R}\left(K \cdot P + S + \frac{N}{D}\right) \quad (1)$$

The first two values in the parenthesis (i.e., the K and P value) are an integer part of the synthesized frequency and the last values in the parenthesis (i.e., the S, N and D values) are a fractional part of the synthesized frequency. In sigma-delta based PLLs, the value of the denominator in the fractional part is very large and thus the frequency resolution can be increased. Table 1 shows an example for the generation of a frequency using a sigma-delta based PLL.

TABLE 1

An example of frequency generation using a sigma-delta PLL.

| $f_{vco}$ | $f_{ref}$ | R | K | P | S | N | D |
|---|---|---|---|---|---|---|---|
| 915.15 MHz | 19.68 MHz | 1 | 4 | 11 | 2 | 987 | 1968 |

One problem of sigma-delta based PLLs are spurious tones related to mismatches in the PLL. For example, a mismatch of the charge pump and the PFD may produce spurious values that are similar to the spurs generated from fractional-N synthesizers.

A randomization property of the sigma-delta modulator 45 may become invalid when there is too much mismatch in the charge pump. In this situation, a fractional spur may appear at the output of the VCO and an offset frequency from the carrier frequency may become equal to the fractional part. In order to avoid or minimize the charge pump mismatch, arrangements may match UP and DOWN currents of the charge pump (based on UP/DOWN signals output from the PFD). However, the accuracy of this kind of compensation may not be sufficient because of the measurement accuracy. Simulations show that a worst-case mismatch (considering process and environmental variations) may exceed several percents.

Figure 3:
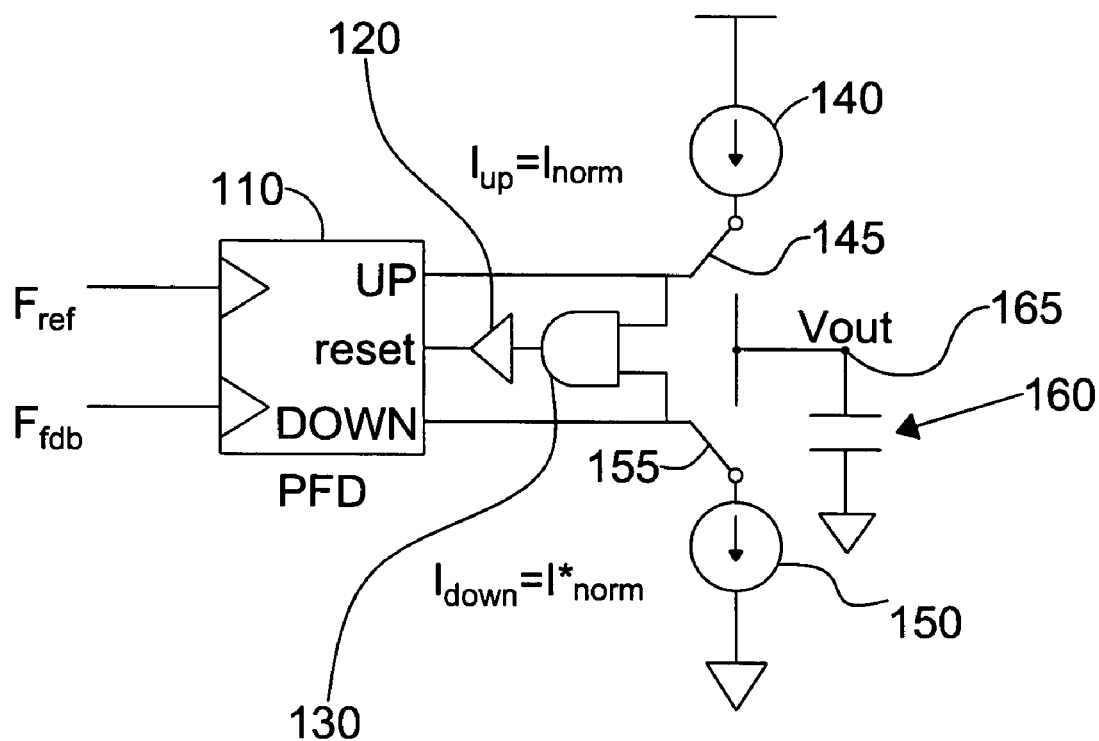
FIG. 3 is a diagram of a phase frequency detector and a charge pump according to an example arrangement.
Figure 4:
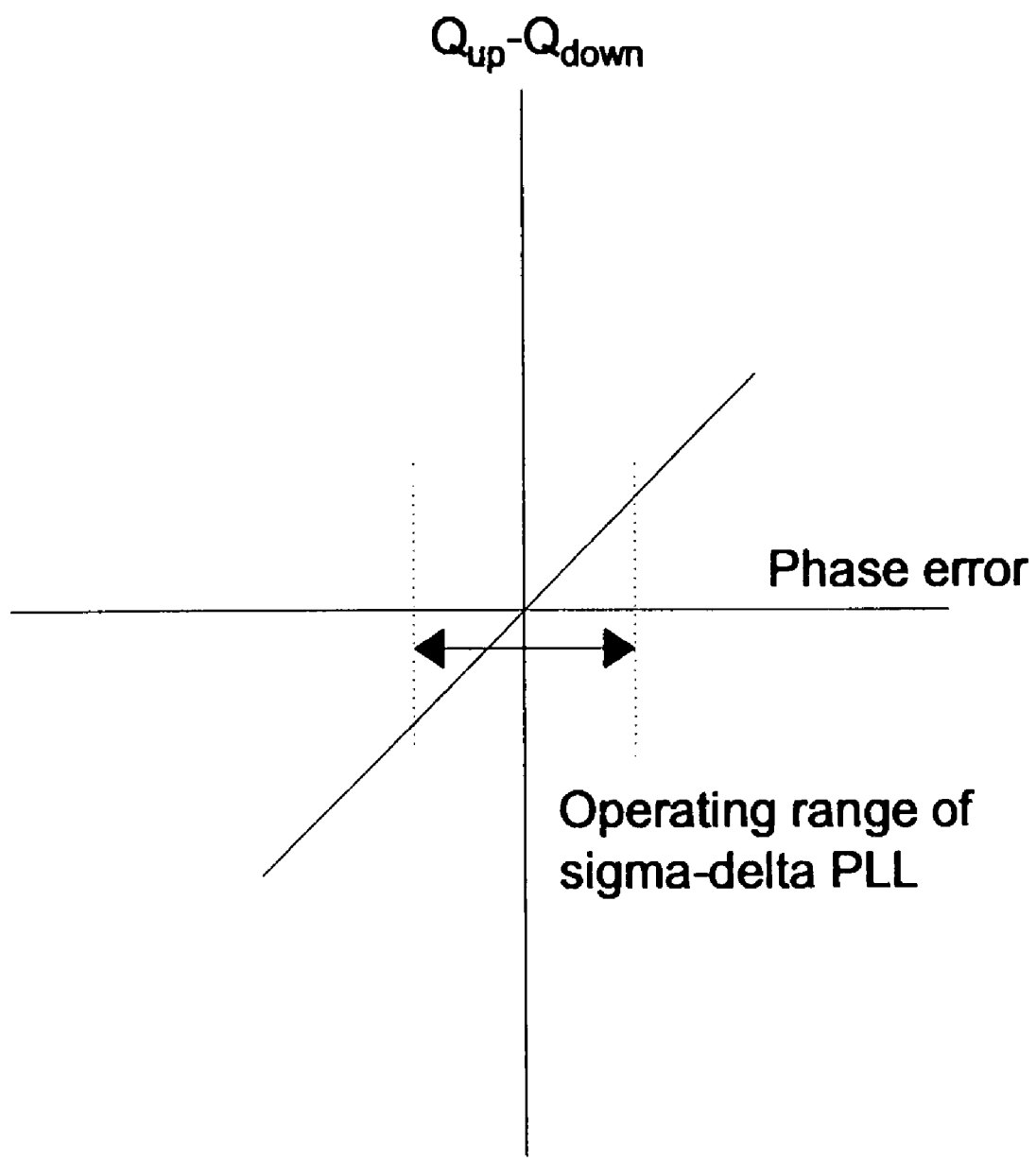
FIG. 4 is a graph showing transfer characteristics of the charge pump based on phase difference without a charge pump mis-match according to an example arrangement.
Figure 5:
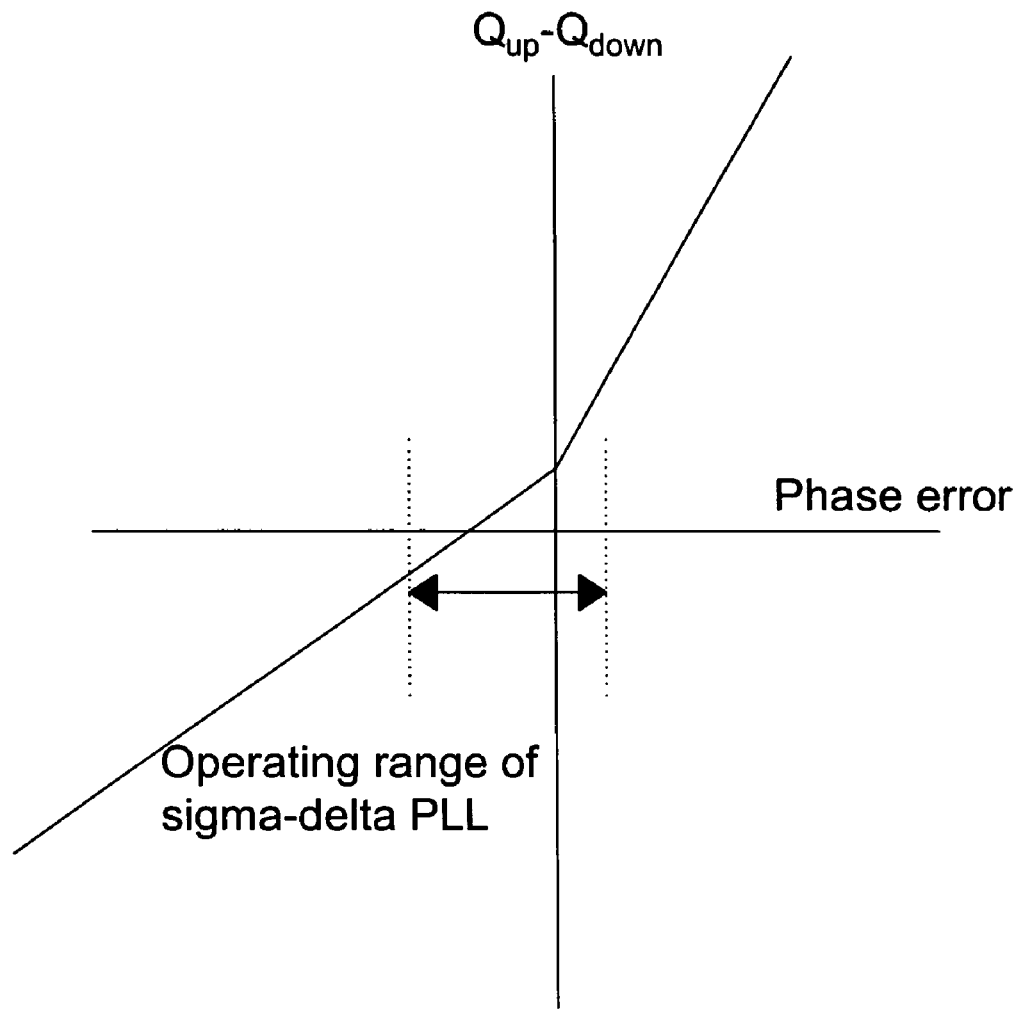
FIG. 5 is a graph showing transfer characteristics of the charge pump based on phase difference with a charge pump mis-match according to an example arrangement.

FIG. 3 is a diagram of a phase frequency detector (PFD) and a charge pump (CP) according to an example arrangement. FIG. 4 is a graph showing transfer characteristics of the charge pump based on phase difference without a charge pump mismatch (i.e., $I_{norm}=I^*_{norm}$) according to an example arrangement. FIG. 5 is a graph showing transfer characteristics of the charge pump based on phase difference with a charge pump mismatch (i.e., $I_{norm} \neq I^*_{norm}$) according to an example arrangement. Other arrangements, graphs and data are also possible.

More specifically, FIG. 3 shows a phase frequency divider (PFD) 110 that receives a reference signal $f_{ref}$ and a feedback signal ($f_{fdb}$) from the VCO (and through the divider circuit 40). The PFD 110 compares the phase of the reference signal $f_{ref}$ and the feedback signal $f_{fdb}$ and outputs an UP signal or a DOWN signal so as to control oscillation of the VCO. The UP signal and the DOWN signal may also be referred to as UP pulse and DOWN pulse, respectively. FIG. 3 also shows an AND gate 130 and a buffer circuit 120 coupled to a RESET input of the PFD 110. The AND gate 130 outputs a signal based on signals on the UP signal line and the DOWN signal line. The buffer circuit 120 provides a delay to prevent any dead zone.

The charge pump may include a current source 140, a current source 150, a capacitor 160 and switches 145 and 155. An output terminal 165 of the charge pump may be coupled to the loop filter to provide a charge (or signal) through the loop filter to the VCO. Based on the UP signal applied to the switch 145, the current source 140 may apply a current $I_{up}$, where $I_{up}=I_{norm}$. Based on the DOWN signal applied to the switch 155, the current source 150 may apply a current $I_{down}$, wherein $I_{down}=I^*_{norm}$. The capacitor 160 acts to store a charge that is injected from the current sources 140 and 150, and then the charge may be dumped through the low-pass filter to the VCO. As such, the current injected from the current sources 140 and 150 may depend on the respective UP and DOWN signals output from the PFD 110.

FIG. 4 shows a situation in which no charge mismatch occurs. This situation represents when $I_{up}$ from the current source 140 is equal to $I_{down}$ from the current source 150. When this occurs, a phase error may not occur at a locked condition and spurious signals may not be generated. Since the net charge transferred to the loop filter should be zero at the locked condition, any phase offset may happen in an opposite direction to cancel out the charge pump mismatch, as shown in FIG. 5.

FIG. 5 shows a situation in which a charge pump mismatch occurs, such as when $I_{up}$ from the current source 140 is not equal to $I_{down}$ from the current source 150. Unlike integer-N synthesizers, a sigma-delta based PLL may change a division factor of the feedback divider 40 and an instantaneous phase of an input of the PFD 110 may vary according to the feedback signal $f_{fdb}$ from the divider 40. Thus, the amount of phase offset may be an average phase of the sigma-delta based PLL. In the transfer curve of the PFD 110, the average phase may be a cross-over point, where a net charge transfer (or $Q_{up}-Q_{down}$) becomes zero. A Q value may be defined as $Q_{(charge)}=I_{(current)} \cdot t_{(time)}$. The instantaneous phase from the feedback divider 40 may move back and forth from this centered value.

A PFD having a reset function based on UP and DOWN signals may be called a 3-state PFD. In addition to the inputs being equal, the other states may include $f_{ref}$ leading $f_{fdb}$ and $f_{ref}$ lagging $f_{fdb}$. When the 3-state PFD is used, operation of the PFD and the charge pump may be quite different from a zero phase error. For example, if the phase error is negative or the reference signal $f_{ref}$ leads the feedback signal $f_{fdb}$, then the DOWN pulse may be fixed in time by a reset delay in the PFD 110. Instead, the UP pulse may have the phase difference information. Accordingly, the charge drawn from the loop filter may be fixed per each comparison cycle, while the sourced charge to the loop filter may be varied according to the phase difference of the two input signals. On the other hand, if the phase error is positive or the feedback signal $f_{fdb}$ leads the reference signal $f_{ref}$, then the UP pulse may be fixed in time by the reset delay in the PFD 110. Instead, the DOWN pulse may have the phase difference information. Thus, the charge drawn from the loop filter may be varied according to the phase difference, while the sourced charge to the loop filter may have the fixed amount per each comparison.

Each UP and DOWN pulse may be made to be very linear according to the phase difference determined by the PFD. However, it may be difficult to absolutely match UP and DOWN currents to keep a same slope of the transfer characteristics around a zero phase error. Thus, if a phase offset caused by a charge pump mismatch lies within a variable operating range of the PFD, the linearity of the charge pump may be severely degraded.

Figure 6:
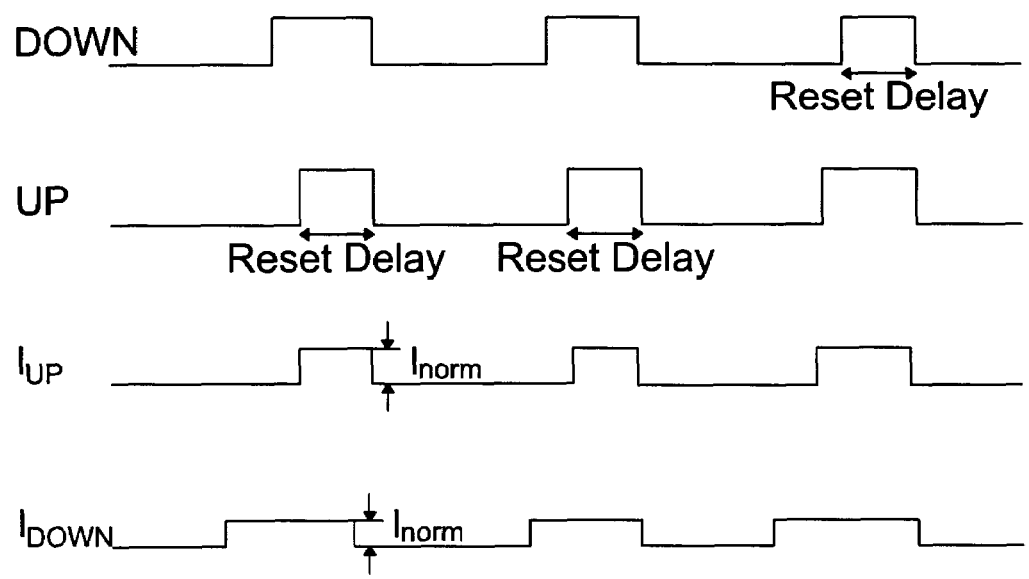
FIG. 6 is a timing diagram of signals related to the charge pump and the PFD of FIG. 3 according to an example arrangement.

FIG. 6 is a timing diagram of signals related to the charge pump and the PFD of FIG. 5 according to an example arrangement. FIG. 6 shows examples of the effect of non-linearity of the charge pump (FIG. 5). Other arrangements, diagrams and data are also possible. Since the UP and DOWN currents have different slopes, a total amount of charge to the loop filter may depend on a sign of a difference between the two current sources 140, 150. The sigma-delta based PLL produces a randomly distributed phase error centered at a locked condition. In the above example, the locked state may have a non-zero phase error due to imbalance of the charge pump, which may have some offset as shown in FIG. 5. The difference in the slope of the transfer characteristics of FIG. 5 may produce non-linear operation of the charge pump from the breaking point.

The magnitude of the undesired spurious signals in a sigma-delta based PLL may be inversely proportional to linearity of the loop for a full operating range of the PFD. This may mean that there is no need to match the UP current and the DOWN current of the charge pump so as to obtain linearity of the PFD in embodiments of the present invention. FIG. 5 shows that the slope or the linearity of the transfer curve changes at (or in) the operating region of the PFD in sigma-delta based PLLs. In this operating region, the spurious performance may become quite poor and thus unacceptable for some high-end cellular applications.

Embodiments of the present invention may provide a linearization technique to reduce spurious tones in sigma-delta based PLLs. Parameters such as a ratio of two charge pump current sources and a reset delay of a PFD may be changed (i.e., increased) to provide better spurious rejection. A zero phase error may be desired to provide a low spurious level in an integer-N based PLL without any mismatch. However, in sigma-delta based PLL, the linearity of the charge pump and PFD may be a factor to determine the spurious tone rather than zero phase offset at locked condition. The intentional ratio mismatch of two current sources may increase the linearity and reduce the spurious tones.

Figure 7:
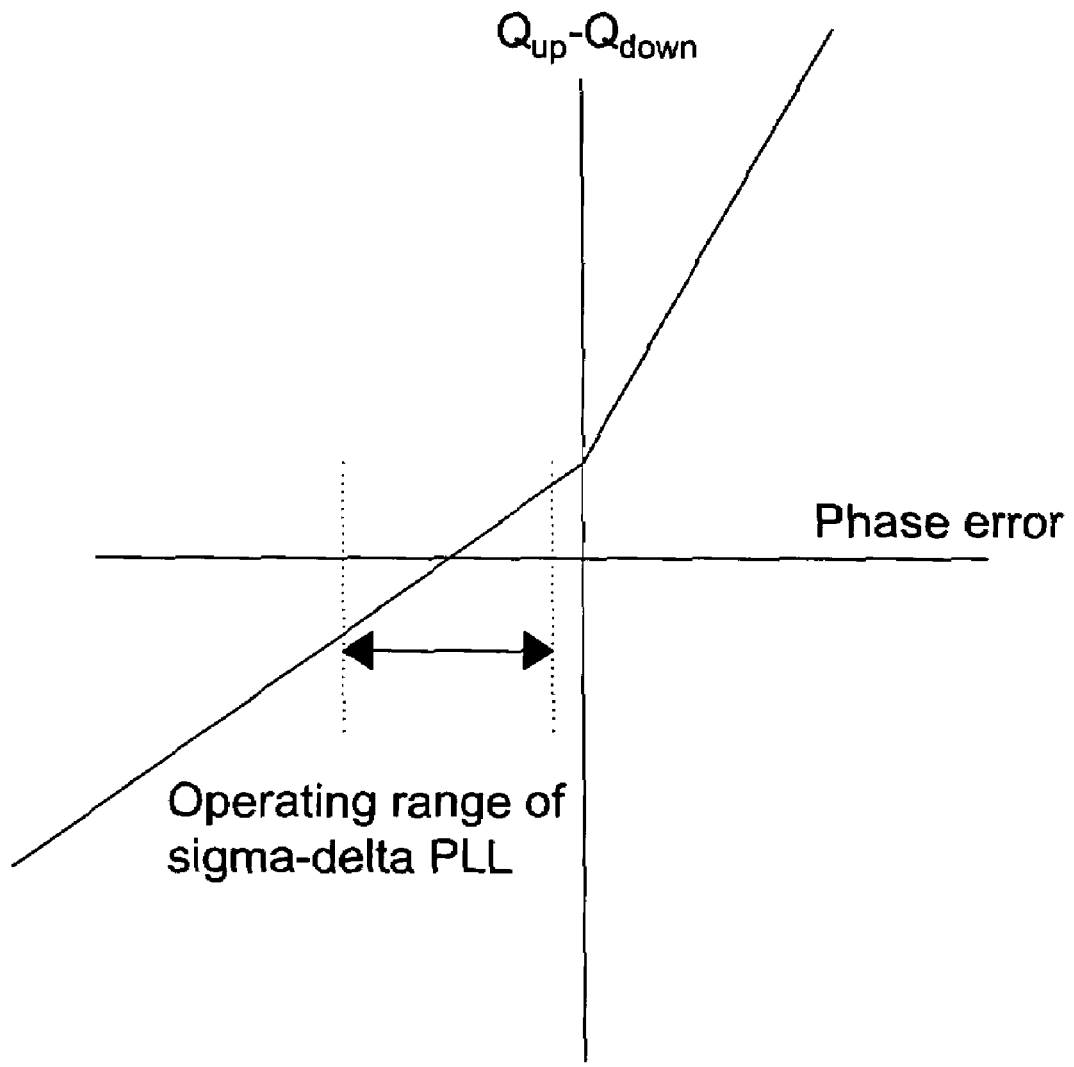
FIG. 7 is a graph showing transfer characteristics of the charge pump based on phase difference according to an example embodiment of the present invention.

FIG. 7 is a graph showing transfer characteristics of a charge pump based on phase difference according to an example embodiment of the present invention. Other embodiments, graphs and data are also within the scope of the present invention. An operating range (or the phase excursion range) of the PFD may depend on a particular implementation of the sigma delta modulator (such as the sigma-delta modulator 45 shown in FIG. 2) and the loop parameter-like loop bandwidth. There may be no undesired spurious signals if an amount of the charge dumped to the loop filter is linearly proportional to a phase difference between the two PFD input signals (i.e., the reference signal $f_{ref}$ and the feedback signal $f_{fdb}$). If the charge pump mismatch becomes excessive, then the operating region of the PFD may change as shown in FIG. 7. Unlike the FIG. 5 arrangement, there is no change in slope and thus the linearity of the loop is maintained for all operating regions of the PFD. Thus, the magnitude of the spurious tones may be very small. In this case, the charge dumped to the loop filter may be proportional to the phase difference. When UP and DOWN current mismatch occurs in FIG. 7, the phase offset between two inputs of the PFD may not be zero at the locked condition. However, this may not cause any problem in synthesizer applications because the frequency information may be the only critical factor, not a phase relationship with the reference signal $f_{ref}$.

Figure 8:
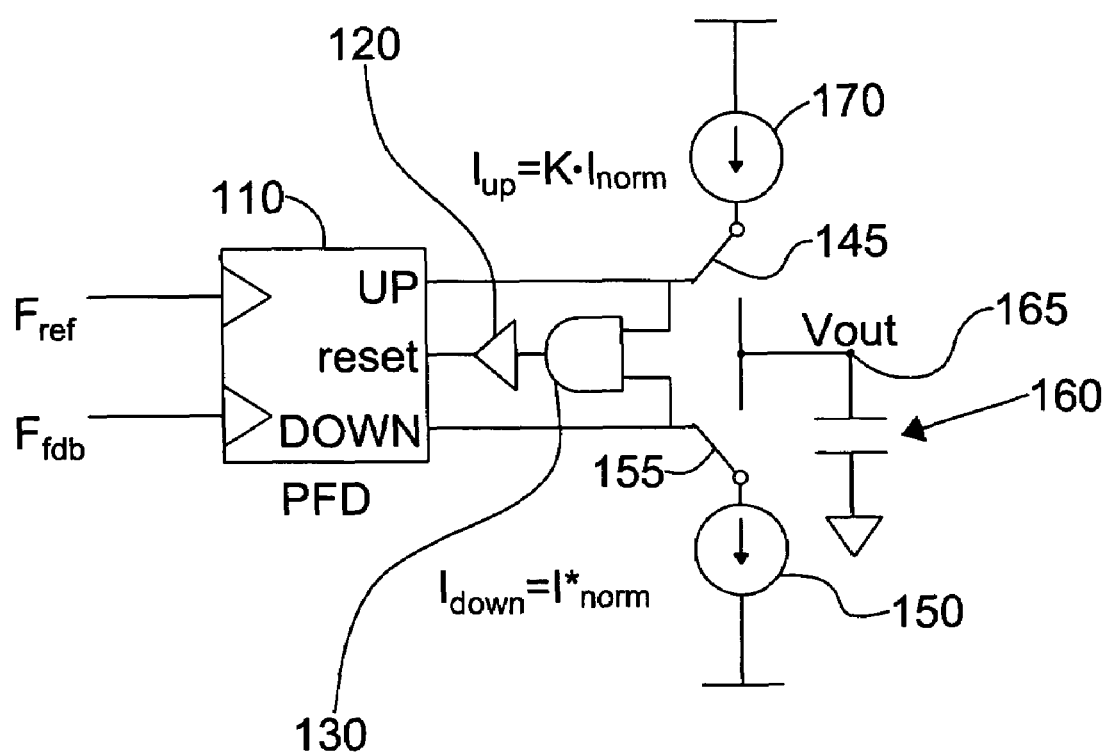
FIG. 8 shows a phase frequency detector and a charge pump according to an example embodiment of the present invention.
Figure 9:
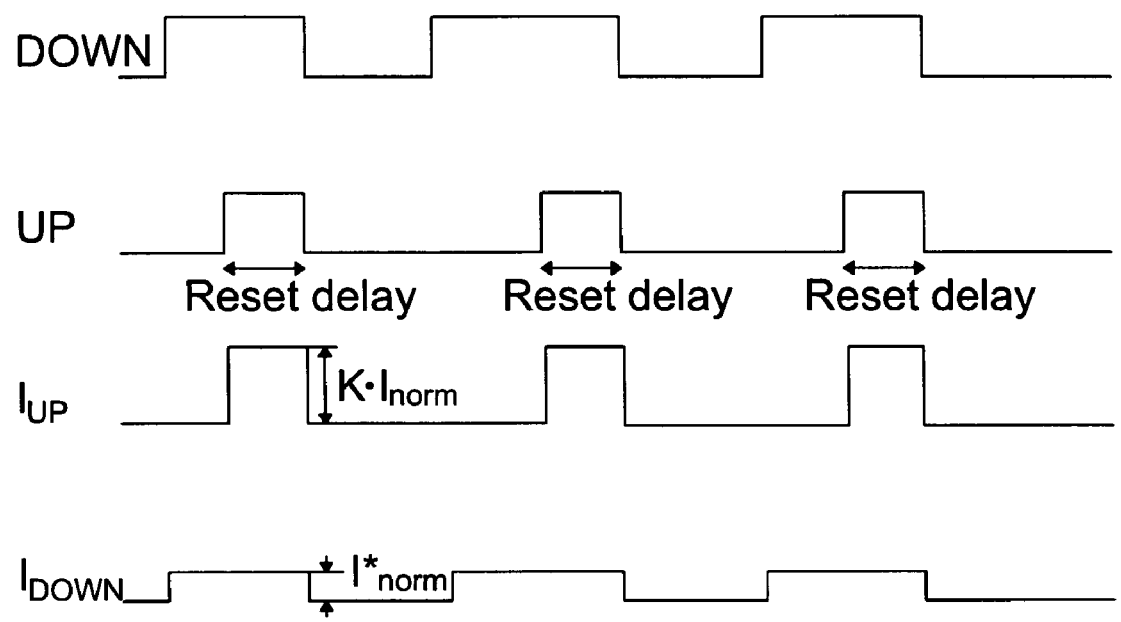
FIG. 9 is a timing diagram of signals related to the charge pump and the PFD of FIG. 8 according to an example embodiment of the present invention.

FIG. 8 is a diagram of a phase frequency detector (PFD) and a charge pump circuit according to an example embodiment of the present invention. FIG. 9 is a timing diagram of signals relating to the charge pump and the PFD of FIG. 8 according to an example embodiment of the present invention. Other embodiments, configurations and diagrams are also within the scope of the present invention. FIG. 8 shows a PFD and a charge pump. Other elements (such as the VCO, the feedback divider and the sigma-delta modulator) are not shown in FIG. 8 for ease of illustration.

Embodiments of the present invention may linearize operation of a sigma-delta based PLL. The UP and DOWN currents of the charge pump may have different magnitudes (as shown in FIG. 8) to provide sufficient phase offset at a locked state (as shown in FIG. 7). For example, a constant multiplication factor of K (in FIG. 8) may be used as a design parameter for either the UP current source or the DOWN current source. The multiplication factor may be large enough to provide linear operation of the PFD (as shown in FIG. 7). The K value may have been previously (or originally) built into the PLL or the K value may be controllable by a control device.

More specifically, FIG. 8 shows the phase frequency divider (PFD) 110 that receives the reference signal $f_{ref}$ and the feedback signal $f_{fdb}$ from the VCO (and through the divider circuit 40). Similar to that discussed above, the PFD 110 compares the phase of the reference signal $f_{ref}$ and the feedback signal $f_{fdb}$ and outputs an UP signal and/or a DOWN signal so as to control oscillation of the VCO. FIG. 8 also shows the AND gate 130 and the buffer circuit 120 coupled to a RESET input of the PFD 110 in a similar manner as discussed above with respect to FIG. 3. The charge pump may include a current source 170, the current source 150, the capacitor 160 and switches 145 and 155. The output terminal 165 may be coupled to the loop filter to provide a charge (or signal) through the loop filter to the VCO. Based on the UP signal applied to the switch 145, the current source 170 may apply a current $I_{up}$, where $I_{up}=K \cdot I_{norm}$. Based on the DOWN signal applied to the switch 155, the current source 150 may apply a current $I_{down}$, where $I_{down}=I^*_{norm}$. The capacitor 160 acts to store a charge that is injected from the current sources 170 and 150, and then the charge may be dumped through the low-pass filter to the VCO. As such, the current injected from the current sources 170 and 150 may depend on the respective UP and DOWN signals output from the PFD 110.

Stated differently, in FIG. 8, the UP current may be increased to shift a cross-over point far from the zero phase error as may be seen by comparing FIG. 4 and FIG. 7. In embodiments of the present invention, the phase error during the operation of the PLL may be negative and thus the DOWN current may have phase error information.

Since the PFD 110 and portions of the charge pump current can be made to have very linear operation, spurious characteristics resulting from this embodiment may be superior to disadvantageous arrangements. In other words, one of the UP and DOWN current sources may provide a fixed amount of charge for each comparison cycle, and the other current source may provide a variable amount of charge proportional to the phase error. There may be another source of error caused by the glitch and some transient due to the switching action of the charge pump circuit. Also, the amount of glitch may be quite different for the switches in the UP and DOWN current sources. The phase shifting may also help the non-linearity caused by this kind of glitch, because one of two current sources has constant operating condition.

FIG. 9 is a timing diagram showing operations of the PFD based on FIGS. 7 and 8. Due to the large intentional mismatch in the UP and DOWN current sources 170 and 150, the DOWN current source 150 may provide a variable amount of charge to the loop filter, whereas the pulse width of the UP current source 170 may be fixed in time. Accordingly, the linearity of the net charge to the loop filter may be guaranteed.

Figure 10:
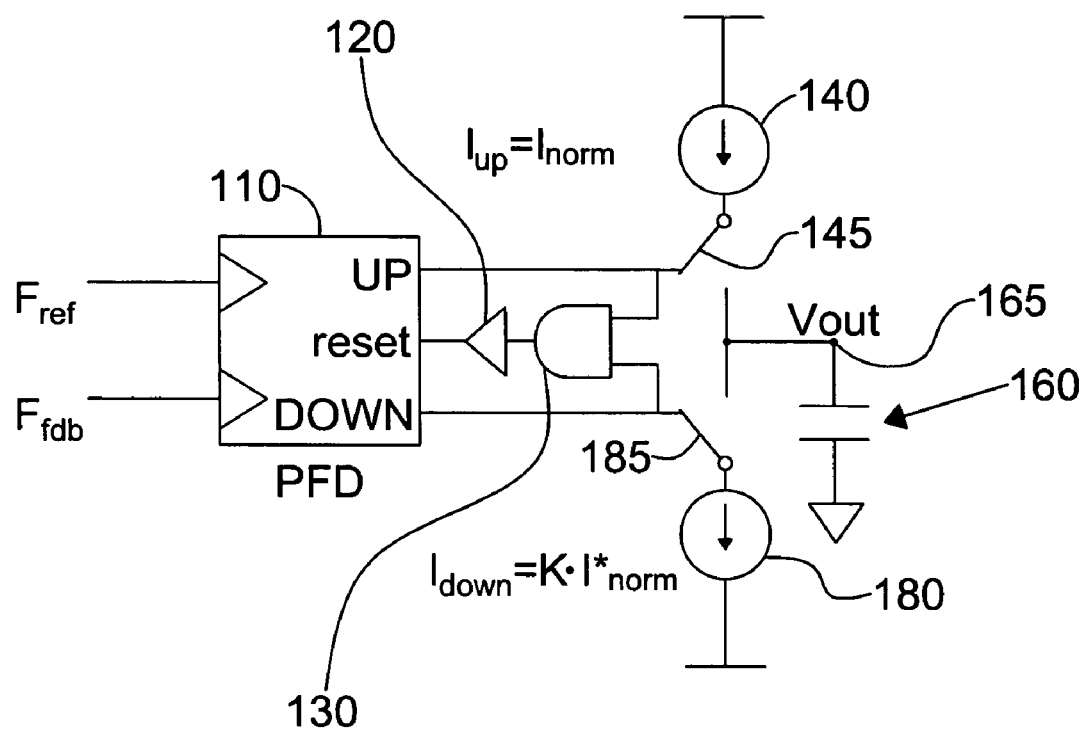
FIG. 10 shows a phase frequency detector and a charge pump according to an example embodiment of the present invention.
Figure 11:
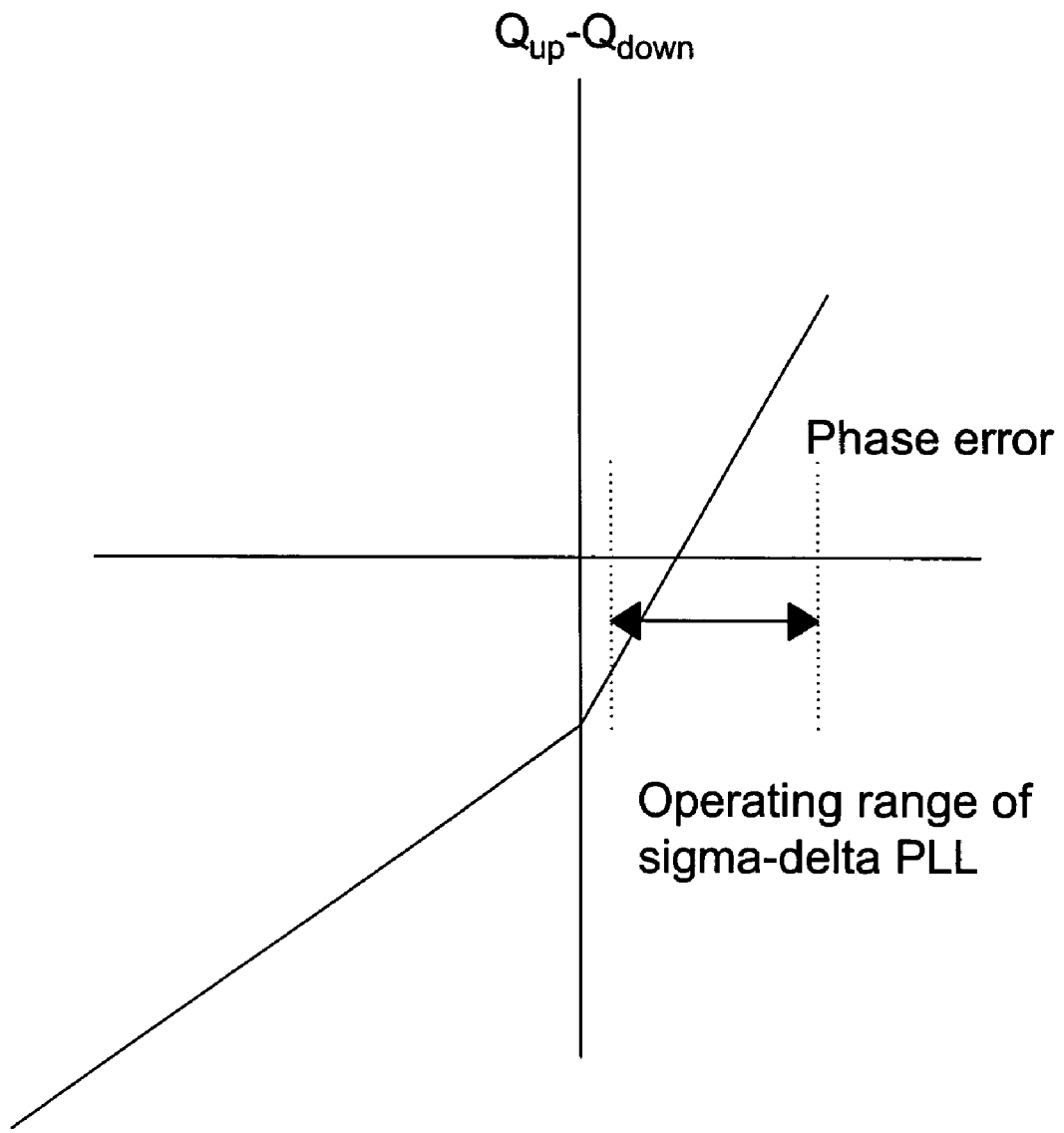
FIG. 11 is a graph showing transfer characteristics of the charge pump based on phase difference according to an example embodiment of the present invention.
Figure 12:
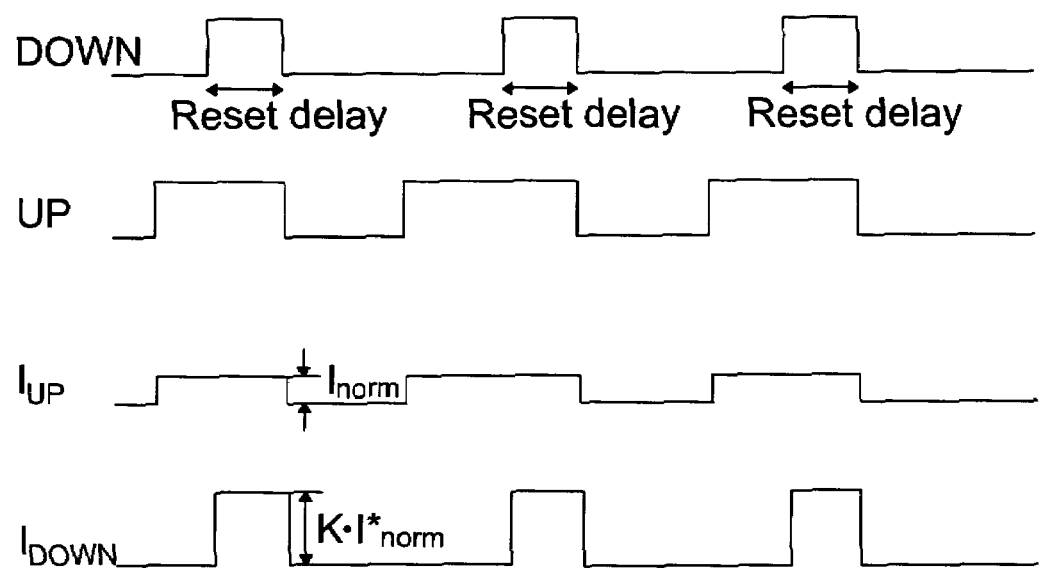
FIG. 12 is a timing diagram of signals related to the charge pump and the PFD of FIG. 10 according to an example embodiment of the present invention.

FIG. 10 shows a phase frequency detector and a charge pump according to an example embodiment of the present invention. FIG. 11 is a graph showing transfer characteristics of the charge pump based on phase difference according to an example embodiment of the present invention. FIG. 12 is a timing diagram of signals related to the charge pump and the PFD of FIG. 10 according to an example embodiment of the present invention. Other embodiments, configurations, and diagrams are also within the scope of the present invention.

More specifically, FIG. 10 shows the phase frequency divider (PFD) 110 that receives the reference frequency signal $f_{ref}$ and the feedback signal $f_{fdb}$ from the VCO. Similar to that discussed above, the PFD 110 compares the phase of the reference signal $f_{ref}$ and the feedback signal $f_{fdb}$ and outputs an UP signal and/or a DOWN signal so as to control oscillation of the VCO. FIG. 10 also shows the AND gate 130 and the buffer circuit 120 coupled to a RESET input of the PFD 110 in a similar manner as discussed above with respect to FIG. 3. The charge pump may include the current source 140, a current source 180, the capacitor 160 and switches 145 and 185. The output terminal 165 of the charge pump may be coupled to the loop filter to provide a charge (or signal) through the loop filter to the VCO. Based on the UP signal applied to the switch 145, the current source 140 may apply a current $I_{up}$ where $I_{up}=I_{norm}$. Based on the DOWN signal applied to the switch 185, the current source 180 may apply a current $I_{down}$, where $I_{down}=K \cdot I^*_{norm}$ The capacitor 160 acts to store a charge that is injected from the current sources 140 and 180, and then the charge may be dumped through the low-pass filter to the VCO. As such, the current injected from the current sources 140 and 180 may depend on the respective UP and DOWN signals output from the PFD 110.

Stated differently, FIG. 10 shows an embodiment that changes the UP current and DOWN current as compared to disadvantageous arrangements so that linearization may be provided. FIG. 10 shows a large DOWN current source 180 related to the constant multiplication factor K. FIG. 11 shows the transfer characteristics when the DOWN current is increased. In this embodiment, the operating range of the sigma-delta based PLL is shifted to a positive phase error. Accordingly, the phase error is positive and only the UP current has phase error information. The DOWN current may be fixed by the reset delay and an amount of the sinking current may be fixed in each comparison as shown in FIG. 12.

Embodiments of the present invention may provide a sigma-delta based PLL that includes a PFD, a charge pump and a VCO. The charge pump may output a charge based on UP and DOWN signal output from the PFD. The charge pump may include a first current source to apply a fixed amount of current and a second current source to apply a variable amount of current. The variable amount of current may be based on a phase error (or phase difference) between input signals of the PFD. An amount of charge output by the charge pump may be linearly proportional to a phase difference of the two input signals of the PFD. Additionally, a magnitude of the first current source may be greater than a magnitude of the second current source.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A phase lock loop device comprising:
   a phase frequency detector to receive a reference signal and a feedback signal, the phase frequency detector to output first and second signals based on a comparison of the reference signal and the feedback signal in a locked condition of the phase lock loop device;
   a charge pump to output a charge based on the first and second output signals from the phase frequency detector;
   a voltage controlled oscillator to output a clock signal based on the received charge from the charge pump, wherein the charge pump comprises,
   at least one first current source coupled to the charge pump to increase a frequency of the clock signal, and
   at least one second current source coupled to the charge pump to decrease a frequency of the clock signal, said at least one first current source to apply a fixed amount of current and said at least one second current source to apply variable amount of current or said at least one second current source to apply the variable amount of current and said at least one first current source to apply the fixed amount of current.

2. The phase lock loop device of claim 1, wherein the variable amount of current is based on a phase error of the reference signal and the feedback signal at the phase frequency detector.

3. The phase lock loop device of claim 1, further comprising a divider circuit to receive the clock signal output from the voltage controlled oscillator and to output the feedback signal to the phase frequency detector.

4. The phase lock loop device of claim 3, further comprising a sigma-delta modulator coupled to the divider circuit.

5. The phase lock loop device of claim 1, wherein an amount of the charge output by the charge pump is linearly proportional to a phase difference between the reference signal and the feedback signal at the phase frequency detector.

6. The phase lock loop device of claim 1, wherein the phase lock loop device comprises a sigma-delta based phased lock loop device.

7. The phase lock loop device of claim 1, the first current source to provide an UP current of the change pump and the second current source to provide a down current of the charge pump, wherein a magnitude of the first current source is greater than a magnitude of the second current source.

8. The phase lock loop device of claim 7, wherein the different magnitudes provide phase offset at the locked condition of the phase lock loop device.

9. The phase lock loop device of claim 1, further comprising a loop filter to receive the charge output from the charge pump, the loop filter provided between the charge pump and the voltage controlled oscillator.

10. A sigma-delta based phase lock loop device comprising:
    a phase frequency detector to receive a reference signal and a feedback signal, the phase frequency detector to output first and second signals based on a comparison of the reference signal and the feedback signal;
    a charge pump to receive the first and second signals from the phase frequency detector, the charge pump having a first current source to provide current to increase a frequency of a clock signal based on the first signal and a second current source to provide current to decrease the frequency of the clock signal based on the second signal, a magnitude of the first current source being different than a magnitude of the second current source, an amount of charge output by the charge pump being proportional to a phase difference between the reference signal and the feedback signal at the phase frequency detector; and
    a voltage controlled oscillator to output the clock signal based on the received charge from the charge pump.

11. The sigma-delta based phase lock loop device of claim 10, wherein the first current source only applies a fixed amount of current and the second current source applies a variable amount of current.

12. The sigma-delta phase lock loop device of claim 11, wherein the variable amount of current is based on the phase difference of the reference signal and the feedback signal at the phase frequency detector.

13. The sigma-delta phase lock loop device of claim 11, further comprising a divider circuit to receive the clock signal output from the voltage controlled oscillator and to output the feedback signal to the phase frequency detector.

14. The sigma-delta phase lock loop device of claim 13, further comprising a sigma-delta modulator coupled to the divider circuit.

15. The sigma-delta phase lock loop device of claim 11, wherein a magnitude of the first current source is greater than a magnitude of the second current source a locked state of the phase lock loop device.

16. The sigma-delta phase lock loop device of claim 15, wherein the different magnitudes provides phase offset at a locked condition of the phase lock loop device.

17. The sigma-delta phase lock loop device of claim 11, further comprising a loop filter to receive the charge output from the charge pump, the loop filter provided between the charge pump and the voltage controlled oscillator.

18. A semiconductor having a sigma-delta based phase lock loop device, the phase lock loop device comprising:
    a phase frequency detector to receive a reference signal and a feedback signal, the phase frequency detector to output UP and DOWN signals based on a comparison of the reference signal and the feedback signal;

a charge pump to receive the UP and DOWN signal from the phase frequency detector, the charge pump having at least one first current source to provide current based on one of the UP signal or the DOWN signal and at least one second current source to provide current based on the other of the UP signal or the DOWN signal, a magnitude of the at least one first current source being greater than a magnitude of the at least one second current source; and a voltage controlled oscillator to output a clock signal based on the received charge from the charge pump, wherein the current source operated by the DOWN signal to decrease a frequency the clock signal and the current source operated by the UP signal to increase the frequency of the clock signal.

19. The semiconductor of claim 18, wherein the at least one first current source applies only a fixed amount of current and the at least one second current source applies a variable amount of current.

20. The semiconductor of claim 19, wherein the variable amount of current is based on a phase error of the reference signal and the feedback signal at the phase frequency detector.

21. The semiconductor of claim 18, further comprising a divider circuit to receive the clock signal output from the voltage controlled oscillator and to output the feedback signal to the phase frequency detector.

22. The semiconductor of claim 21, further comprising a sigma-delta modulator coupled to the divider circuit.

23. The semiconductor of claim 18, wherein an amount of charge provided by the charge pump is linearly proportional to a phase difference between the reference signal and the feedback signal at the phase frequency detector.

24. The semiconductor of claim 18, wherein the different magnitudes provide phase offset at a locked condition of the phase lock loop device.

25. The semiconductor of claim 18, wherein the phase lock loop device further comprises a loop filter to receive the charge from the charge pump, the loop filter provided between the charge pump and the voltage controlled oscillator.

* * * * *